United States Patent [19]
Tokunaga et al.

[11] Patent Number: 5,985,455
[45] Date of Patent: Nov. 16, 1999

[54] SEMICONDUCTOR ELEMENT SEALED WITH AN EPOXY RESIN COMPOUND

[75] Inventors: Atsuto Tokunaga, Nagoya; Yasushi Sawamura, Otsu; Masayuki Tanaka, Nagoya, all of Japan

[73] Assignee: Toray Industries, Inc., Japan

[21] Appl. No.: 09/095,632

[22] Filed: Jun. 11, 1998

Related U.S. Application Data

[62] Division of application No. 08/696,916, filed as application No. PCT/JP95/02742, Dec. 27, 1995, Pat. No. 5,798,400.

[30] Foreign Application Priority Data

Jan. 5, 1995 [JP] Japan .......................................... 7-163

[51] Int. Cl.$^6$ .......................... B32B 27/38; H01L 21/203; C08L 63/00
[52] U.S. Cl. .......................... 428/413; 428/418; 438/106; 523/443; 523/466; 524/919; 525/481; 525/523
[58] Field of Search .................................... 523/443, 466; 524/919; 525/481, 523; 428/413, 418; 438/106

[56] References Cited

U.S. PATENT DOCUMENTS

| | | | |
|---|---|---|---|
| 4,383,060 | 5/1983 | Dearlove et al. | 523/429 |
| 5,070,154 | 12/1991 | Shiobara et al. | 525/502 |
| 5,306,747 | 4/1994 | Ito et al. | 525/487 |
| 5,578,660 | 11/1996 | Fujita et al. | 525/481 |

FOREIGN PATENT DOCUMENTS

| | | |
|---|---|---|
| 57-73955 | 5/1982 | Japan . |
| 58-151318 | 9/1983 | Japan . |
| 61-097322 | 5/1986 | Japan . |
| 62-151447 | 7/1987 | Japan . |
| 3-29259 | 4/1991 | Japan . |
| 4-50222 | 2/1992 | Japan . |
| 4-63846 | 2/1992 | Japan . |
| 4-218523 | 8/1992 | Japan . |
| 4-370138 | 10/1992 | Japan . |
| 62-132944 | 9/1993 | Japan . |
| 2225323 | 9/1993 | United Kingdom . |

*Primary Examiner*—Randy Gulakkowski
*Attorney, Agent, or Firm*—Austin R. Miller

[57] ABSTRACT

Disclosed herein is an epoxy resin compound including an epoxy resin (A), a hardener (B), and an inorganic filler, characterized in that said inorganic filler contains silica (C) as an essential component, said hardener (B) is one which contains at least two phenolic hydroxyl groups and/or naphtholic hydroxyl groups in the molecule, and said silica (C) contains 1–99 wt % of synthetic silica and 99–1 wt % of natural fused silica. Disclosed also herein is a semiconductor device having a semiconductor element sealed therein with said epoxy resin compound. The epoxy resin compound does not cause such troubles as short shot, resin peeling, wire breakage, stage shift, and vent clogging at the time of molding. In addition, when used as a sealing material, it yields semiconductor devices which have good reliability at high temperature and high humidity and good resistance to soldering heat.

14 Claims, No Drawings

SEMICONDUCTOR ELEMENT SEALED WITH AN EPOXY RESIN COMPOUND

This application is a divisional of application Ser. No. 08/696,916, filed Aug. 22, 1996, incorporated herein by reference now U.S. Pat. No. 5,798,400, which was the U.S. National Stage (371) of PCT/JP95/02742, filed Dec. 27, 1995.

TECHNICAL FIELD

The present invention relates to a semiconductor device comprising a semiconductor element sealed with an epoxy resin compound, a precision part, and a semiconductor device ulitizing the compound. More particularly, the present invention relates to a semiconductor element sealed with a moldable epoxy resin compound that is capable of smooth molding, free from such problems as short shot, resin peeling, wire breakage, stage shift, and vent hole clogging, and also to a semiconductor device sealed with said epoxy resin compound which offers improved reliability at high temperature and humidity and good resistance to soldering heat.

BACKGROUND ART

Among many resin compounds are epoxy resin compounds consisting of epoxy resin, hardener, inorganic filler, and other additives. They find general use its molding materials on account of good electrical and mechanical characteristics.

Resin compounds such as phenolic, silicone and epoxy resin compounds are commonly used for sealing semiconductor devices, because they offer higher productivity and lower production cost than any other sealing materials. Of these resin compounds, epoxy-based ones are predominant because of their low price, good productivity, and balanced properties. Resin sealing by the conventional technology, however, involves many practical problems as the result of the recent semiconductor technology tending toward larger and thinner packages provided with more pins than before. A typical example of such problems is associated with molding. That is, the sealing of large packages with a conventional resin compound causes a short shot to occur (at the time of transfer molding) which leads to such defects as pinholes. Similarly, the sealing of multiple-pin packages suffers resin peeling due to incomplete adhesion. Moreover, thinner packages present difficulties in sealing with conventional resin compounds because they offer only a limited allowance for the dislocation of the chip and its wires that occurs at the time of sealing.

In order to address these problems, there have been proposed several methods for improving the flowability of the resin compounds. One way to achieve this object is by the lowering of viscosity through reduction of inorganic filler, change of gel time, and modification of the resin itself. It turned out, however, that these measures do not meet all the requirements for the strength and glass transition point of resins, the reliability of semiconductor devices at high temperature and humidity, the resistance of package to cracking due to soldering heat, and the molding cycle governing productivity. Any attempt to improve flowability often ends up with the clogging of vent holes by the resin compound which has entered the mold after repeated transfer molding.

An attempt has been made to improve the flowability of resin compounds at the time of molding by specifying the particle shape of inorganic filler. It is successful in achieving its original object but is not successful in improving reliability at high humidity and resistance to soldering heat and also improving moldability, thereby eliminating resin peeling.

There is disclosed in European Patent Laid-open No. 0,450,944 an epoxy resin compound composed of a biphenyl-skeleton epoxy resin, a hardener, and silica with a specific particle size. This epoxy resin compound is claimed to have improved resistance to soldering heat. Nevertheless, it does not completely solve the above-mentioned problems.

With the technical background mentioned above, the present invention was completed to achieve the following objects.

(1) To provide a semiconductor device comprising a semiconductor element sealed with a new epoxy resin compound which has a low melt viscosity, causes no vent hole clogging after repeated molding operation, and yields molded products free of resin peeling, pinholes, and stage shift.

(2) To provide a semiconductor device comprising a semiconductor element sealed with a new epoxy resin compound which, when used as a sealing material, yields semiconductor devices having improved reliability at high temperature and humidity and good resistance to soldering heat.

DISCLOSURE OF THE INVENTION

The first aspect of the present invention resides in a semiconductor element sealed with an epoxy resin compound including an epoxy resin (A), a hardener (B), and an inorganic filler, characterized in that said inorganic filler contains silica (C) as an essential component, said hardener (B) is one which contains at least two phenolic hydroxyl groups and/or naphtholic hydroxyl groups in the molecule, and said silica (C) contains 1–99 wt % of synthetic silica and 99–1 wt % of natural fused silica.

The second aspect of the present invention resides in a process for producing a semiconductor element sealed with an epoxy resin compound for semiconductor sealing, said process comprising a first step of fusing a substance composed mainly of naturally-occurring $SiO_2$, thereby giving natural fused silica, a second step (either preceding or following said first step) of performing chemical reaction on a silicon-containing substance which is not composed mainly of $SiO_2$, thereby giving synthetic silica composed mainly of $SiO_2$, and a third step of mixing together an epoxy resin (A), a hardener (B) containing at least two phenolic hydroxyl groups and/or naphtholic hydroxyl groups in the molecule, the synthetic silica (1–99 wt % of the total amount of silica) obtained in said second step, and the natural fused silica (99–1 wt % of the total amount of silica) obtained in said first step.

The third aspect of the present invention resides in a semiconductor device which is sealed with an epoxy resin compound defined above.

The epoxy resin compound pertaining to the present invention has such greatly improved moldability that it permits the sealing of semiconductor devices without such troubles as short shot, resin peeling, wire breakage, stage shift, and vent hole clogging.

The epoxy resin compound as a sealing material affords semiconductor devices which offer improved reliability at high temperature and humidity and good resistance to soldering heat. In addition, owing to its good moldability, it also finds use as a molding material for precision parts apart from semiconductor devices.

BEST MODE FOR CARRYING OUT THE INVENTION

The following describes in detail the constitution and effect of the present invention.

The term "epoxy resin (A)" as used in the present invention embraces any resins having epoxy groups in the molecule which are not specifically restricted.

Examples of epoxy resin (A) include bisphenol A epoxy resins, bisphenol C epoxy resins, hydrogenated bisphenol epoxy resins, bisphenol F epoxy resins, phenol novolak epoxy resins, cresol novolak epoxy resins, cycloaliphatic epoxy resins having, for example, dicyclopendadiene rings, biphenyl epoxy resins, and epoxy-modified organosilicone. They may be used alone or in combination with one another.

Of these epoxy resins, those containing more than 50 wt % of biphenyl epoxy resin represented by the formula (I) or (II) below are preferable in the present invention.

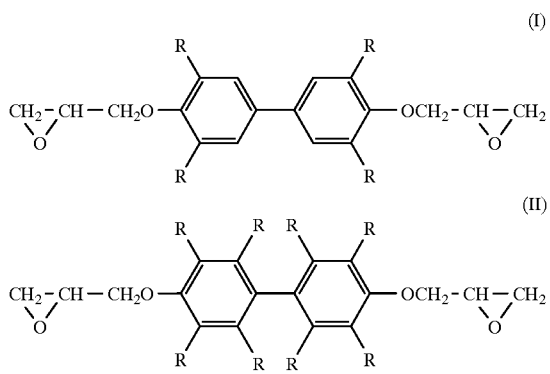

(where R's identically or differently denote hydrogen atoms or monovalent organic groups, usually with 1 to 4 carbons.) They may have a partly polymerized structure resulting from the reaction of epoxy groups.

Preferred examples of the epoxy resins represented by the formula (I) above include diglycidyl ether of 4,4'-dihydroxybiphenyl, diglycidyl ether of 3,3',5,5'-tetramethyl-4,4'-dihydroxybiphenyl, diglycidyl ether of 3,3',5,5'-tetra-tert-butyl-4,4'-dihydroxybiphenyl, diglycidyl ether of dimethyldipropylbiphenol, and diglycidyl ether of dimethyl biphenol.

There are no specific restrictions on hardener (B) used in the present invention, so long as it is capable of hardening reaction with epoxy resin (A). It is characterized by the possession of at least two phenolic and/or naphtholic hydroxyl groups in the molecule. (Phenolic hydroxyl groups originate from phenol group, cresol group, xylenol group, etc.)

Examples of hardener (B) used in the present invention include phenol novolak resin, cresol novolak resin, naphthol novolak resin, copolymers of these novolak resins, bisphenol A, bisphenol F, phenol aralkyl resin, naphthol aralkyl resin, tris-hydroxymethane, tris-hydroxyethane, bisphenol resin, and copolymers thereof.

These hardeners may be used alone or in combination with one another. The amount of hardener (B) should preferably be 33–300 parts by weight for 100 parts by weight of epoxy resin (A). An adequate amount in terms of functionality is such that the ratio of the epoxy equivalent of epoxy resin (A) to the hydroxyl equivalent of hardener (B) is in the range of 0.7 to 1.3.

According to the present invention, silica (C) should contain 1–99 wt % of synthetic silica as an essential component. Below this content, the resulting resin compound is liable to peeling at the time of molding. Above this content, the resulting resin compound encounters external pinholes and poor flowability at the time of molding.

By the term "synthetic silica" is meant artificially synthesized silica obtained by chemical reaction from a substance (starting material) which does not contain $SiO_2$ as a principal component. It is not specifically restricted.

Synthetic silica may be obtained from different starting materials by different methods, for example, from silicon by oxidation reaction, from dialkyldialkoxysilane (such as tetraalkoxysilane (or tetraalkyl orthosilicate) and monoalkyltrialkoxysilane) by sol-gel method, from chlorosilane (such as tetrachlorosilane, trichlorosilane, and monoalkyltrichlorosilane) by hydrolysis and subsequent dehydration with heating or by direct decomposition and oxidation with oxygen-hydrogen flame, from polysiloxane by oxidation, and so on.

There are no specific restrictions on the particle size of synthetic silica as an essential component of silica (C). However, it should preferably be in the range of 0.1–30 μm, more desirably 0.1–3.0 μm, in terms of average particle diameter (or median diameter for R=50%). This range should be observed so that the epoxy resin compound meets the requirements for improved reliability at high temperature and humidity and good resistance to soldering heat, and also for protection of semiconductor chips from damage.

There are no specific restrictions on the particle size of synthetic silica as an essential component of silica (C). However, it should preferably be in the range of 0.1–30 μm, more desirably 0.1–3.0 μm, most desirably 0.1–1 μm, in terms of average particle diameter (or median diameter for R=50%). This range should be observed so that the epoxy resin compound meets the requirements for improved reliability at high temperature and humidity and good resistance to soldering heat, and also for protection of semiconductor chips from damage and contamination with impurities.

There are no specific restrictions on the particle shape of synthetic silica. However, it should preferably be spherical for the most part, with angular particles accounting for less than 50 wt %.

According to the present invention, silica (C) should be composed of 1–99 wt % of synthetic silica and 99–1 wt % of natural fused silica. The latter is one which is obtained by fusing silicastone or the like (as a starting material) which contains $SiO_2$ as a principal component.

There are no specific restrictions on the particle size of natural fused silica. However, it should preferably be in the range of 0.1–50 μm, more desirably 3–50 μm, so that the epoxy resin compound meets the requirements for improved reliability at high temperature and humidity and good resistance to soldering heat.

There are no specific restrictions on the particle shape of natural fused silica. However, for good flowability at the time of molding, it should preferably be spherical for the most part, with angular particles accounting for less than 30 wt % of the total amount of silica (C).

The amount of synthetic silica should be 1–90 wt %, preferably 5–95 wt %, with the lower limit being 5 wt % and preferably 10 wt %, and the upper limit being 50 wt % and preferably 30 wt %. The amount of natural fused silica should be 99–1 wt %, preferably 95–5 wt %, with the lower limit being 50 wt %, preferably 70 wt %, and the upper limit being 95 wt %, preferably 90 wt %.

There are no specific restrictions on the amount of silica (C) in the epoxy resin compound of the present invention. However, it should preferably be more than 85 wt %, preferably more than 89 wt %, of the total amount, so that the epoxy resin compound meets the requirements for improved reliability at high temperature and humidity and good resistance to soldering heat.

The effect of the present invention will be enhanced by incorporation of the epoxy resin compound with a silane coupling agent, which is a silicon compound having organic groups (such as amino group) and hydrolyzable groups (such as alkoxyl groups, acetoxy groups, and halogen atoms) directly connected to the silicon atom. An adequate amount of the silane coupling agent is in the range of 0.01 to 5 wt % of the total amount of the epoxy resin coumpound. Amino coupling agents may contain amino groups in the secondary form, preferably partly or more preferably entirely. Examples of the silane coupling agent are given below. Those which have an unsubstituted organic group include vinyl trimethoxysilane, vinyltriethoxy silane, vinyltriacetoxysilane, and vinyltrichlorosilane. Those which have an epoxy group include γ-glycidoxypropyltrimethoxysilane and γ-glycidoxypropyltriethoxysilane. Those which have one or more amino groups include γ-aminopropyltrimethoxysilane, γ-aminopropyltriethoxysilane, γ-(2-aminoethyl)aminopropyltrimethoxysilane, γ-(2-aminoethyl) aminopropyltriethoxysilane, γ-anilinopropylmethoxysilane, γ-anilinopropyltriethoxysilane, N-β-(N-vinylbenzyl-aminoethyl)-γ-aminopropyltrimethoxysilane, and N-β-(N-vinylbenzylaminoethyl)-γ-aminopropyltriethoxysilane. Other examples include γ-mercaptopropyltrimethoxysilane, γ-mercaptopropyltrimethoxysilane, γ-ureidopropyltrimethoxysilane, γ-ureidopropyltriethoxysilane, and γ-methacryloxypropyldimethoxysilane.

The epoxy resin compound of the present invention may be incorporated with a variety of mold release agents such as waxes (including polyethylene wax, carnauba wax, and montan wax), metal salts of fatty acids (including magnesium stearate), long-chain fatty acids and their metal salts, esters, and amides, and modified silicone compounds.

The epoxy resin compound of the present invention may be incorporated with a variety of flame retardants (and auxiliaries thereof) if it is to be used for semiconductor devices which need flame retardance. Examples of flame retardants include organohalogen compounds (such as glycidyl ether of brominated bisphenol A, brominated cresol novolak, and brominated epoxy resin) and phosphorus compounds. Examples of flame retardant auxiliaries include antimonic oxide, antimony tetraoxide, and antimonous oxide. The flame retardants and auxiliaries thereof should be used in a limited amount because they liberate halogen and antimony which adversely affect reliability at high temperature and humidity and resistance to soldering heat. Their adequate amount should be such that their halogen and antimony content is less than 0.2 wt % each of the epoxy resin compound.

The epoxy compound of the present invention may contain, in addition to silica (C), an inorganic filler in an adequate amount not harmful to the effect of the present invention. Examples of the inorganic filler include alumina, zirconia, magnesia, borosilicate glass, calcium carbonate, magnesium carbonate, clay, talc, calcium silicate, titanium oxide, antimony oxide, and hydrotalcite. There are no specific restrictions on the amount of inorganic filler; however, an adequate amount is more than 85 wt %, preferably more than 95 wt %, so that the resulting epoxy resin compound meets requirements for improved reliability at high temperature and humidity and good resistance to soldering heat.

The epoxy resin compound of the present invention may be incorporated with a variety of accelerators such as phosphine compounds, phosphonium salts, and amino compounds enumerated below.

Phosphine compounds: triphenyl phosphine, tri-m-tolyl phosphine, tri-p-tolyl phosphine, tri-o-tolyl phosphine, and tris-(2,6-dimethoxyphenol)phosphine.

Phosphonium salts: tetraphenylphosphonium bromide, tetraethylphosphonium bromide, tetrabutylphoshonium bromide, tetraphenylphosphoniumtetraphenyl borate, tetraethylphosphoniumtetraphenyl borate, and tetrabutylphosphoniumtetraphenyl borate.

Amine compounds: imidazole, 1-methylimidazole, 2-methylimidazole, 1,2-dimethylimidazole, 1-phenylimidazole, 2-phenylimidazole, 1-benzylimidazole, 1,8-diazabicyclo-[5.4.0] lundecene (DBU), phenol salt of DBU, phenol-novolak salt of DBU, octyl salt of DBU, p-toluenesulfonate of DBU, and 1,5-diazabicyclo[4.3.0] nonene (DBN).

In addition, the epoxy resin compound of the present invention may be incorporated with a variety of coloring agents and pigments (such as carbon black and iron oxide), a variety of elastomers (such as silicone rubber, olefin copolymer, modified nitrile rubber, and modified polybutadiene rubber), a variety of thermoplastic resins (such as polyethylene), and a crosslinking agent (such as organic peroxide).

The epoxy resin compound of the present invention may be produced by mixing together epoxy resin (A), hardener (B), inorganic filler, and other additives using a Banbury mixer or the like, subsequently melt-mixing the mixture using a mixing machine such as single-screw extruder, twin-screw extruder, kneader, and hot roll, and finally crushing the mixture after cooling.

The thus obtained epoxy resin compound can be molded into precision parts. It yields precision parts superior in dimensional stability if it contains more than 85 wt % of silica (C). The size of precision parts should preferably be such that their circumscribed sphere has a diameter smaller than 30 mm.

The semiconductor device pertaining to the present invention is characterized by the sealing of a semiconductor chip with the above-mentioned epoxy resin compound. It has a good external appearance and offers improved reliability at high temperature and humidity and good resistance to soldering heat.

EXAMPLES

The invention will be described in more detail with reference to the Examples and Comparative Examples that follow the description of the synthetic silica and natural fused silica used in them.

[Preparation of synthetic silica—1] In ethanol was dissolved 1 mol of tetraethyl o-silicate, and a 1:4 mixture (in mol) of ammonia and water was added to the solution for hydrolysis. The resulting silica was dried, fired, and crushed. Thus there was obtained synthetic silica A-1 in crushed form. The synthetic silica A-1 was crushed further for a prescribed period of time and sifted (with the sieve opening being 74 μm). Thus there was obtained synthetic silica A-2 in crushed form. A-1 and A-2 were found to have an average particle diameter of 50 μm and 20 μm, respectively, measured by the laser light scattering method.

[Preparation of synthetic silica—2] In ethanol was dissolved 1 mol of tetraethyl o-silicate, and a 1:50 mixture (in mol) of γ-aminopropyltrimethoxysilane and water was added to the solution. The resulting turbid liquid was separated and treated with a 1:1 water/methanol mixture. Upon drying at 500° C. for 24 hours, there was obtained synthetic silica A-3 in spherical form. The Silica A-3 was found to have an average particle diameter of 0.3 μm measured by the laser light scattering method.

[Preparation of synthetic silica—3] Hydrolysis, followed by heating, of trichlorosilane (as a starting material) in the usual way gave synthetic silica A-4 and synthetic silica A-5 having average particle diameters of 12 μm and 40 μm, respectively. Explosive gas-phase oxidation, followed by agglomeration, gave synthetic silica A-6 and synthetic silica A-7 having an average particle diameter of 0.5 μm and 1.0 μm, respectively.

[Preparation of natural fused silica] Five kinds of natural fused silica B-1 to B-5 differing in particle shape and size were prepared from silicastone by fusing and subsequent crushing or sphering.

The above-mentioned silica samples are tabulated below.

TABLE 1

Silica Samples

| Designation | Shape | Average particle diameter (μm) | Type |
| --- | --- | --- | --- |
| A-1 | crushed | 50 | Synthetic silica |
| A-2 | crushed | 20 | |
| A-3 | spherical | 12 | |
| A-4 | spherical | 40 | |
| A-5 | spherical | 0.5 | |
| A-6 | spherical | 1 | |
| B-1 | crushed | 80 | Natural fused silica |
| B-2 | crushed | 12 | |
| B-3 | spherical | 12 | |
| B-4 | spherical | 22 | |
| B-5 | spherical | 37 | |

Examples 1 to 20 and Comparative Examples 1 to 13

In each example, a mixture was prepared from any of epoxy resins (I) to (IV), any of hardeners (I) to (IV), any of synthetic silica (A-1) to (A-6), and any of natural fused silica (B-1) to (B-5) according to the formulations shown in Tables 2 to 5. (The epoxy resins and hardeners are specified later, and the silica has been specified above.) The mixture (in a total amount of 100 pbw) was incorporated with 0.6 pbw of γ-glycidoxypropyltriethoxysilane, 0.3 pbw of montan wax, and 0.1 pbw of carbon black. The mixture was further incorporated by dry blending with 1.0 pbw of triphenylphosphine for 100 pbw of the total amount of the epoxy resin and hardener. This step was followed by extrusion for melt mixing. Finally, the extrudate was crushed to give an epoxy resin compound in pellet form.

Each epoxy resin compound was tested as follows for characteristic properties required for use as a semiconductor sealing material. The results are shown in Tables 2 to 5.

Description of epoxy resin:

I . . . diglycidyl ether of 3,3',5,5'-tetramethyl-4,4'-dihydroxybiphenyl (epoxy equivalent=195)

II . . . 1:1 (by weight) mixture of epoxy resin (I) and diglycidyl ether of 4,4'-dihydroxybiphenyl III . . . glycidyl-etherified o-cresol novolak (epoxy equivalent=200)

IV . . . glycidyl-etherified bisphenol A (epoxy equivalent=185)

Description of hardener:

I . . . phenol novolak (hydroxyl equivalent=107)

II . . . copolymer novolak of phenol and naphthol (hydroxyl equivalent=114)

III . . . condensation copolymer of phenol and p-methoxyxylene (hydroxyl equivalent=175) "Xylok"

IV . . . tris(hydroxyphenyl)methane (hydroxyl equivalent=97)

Test methods and criteria:

Melt viscosity

The epoxy resin compound was measured for minimum melt viscosity at 175° C. by using a Koka-type flow tester.

Hot hardness

The epoxy resin compound was molded into a discoid specimen (4 cm in diameter and 3 mm thick) at a molding temperature of 175° C. and a molding cycle of 90 seconds. Immediately after molding, the specimen was measured for Barcol hardness.

Moldability

The epoxy resin compound was molded into a 160-pin QFP (quad flat package) at a molding temperature of 175° C. and a molding cycle of 90 seconds. The package was visually inspected for appearance to see if it suffered resin peeling and external pinholing. Also, the mold was checked for vent clogging due to repeated molding.

Resin peeling (rated by the following criterion)
  5: no peeling
  4: peeling in less than 2% of the surface area
  3: peeling in 2–5% of the surface area
  2: peeling in more than 5% of the surface area Pinhole (rated by the following criterion in terms of an average of 10 specimens)
  5: no pinholes
  4: less than 0.8 pinholes smaller than 0.5 mm in diameter
  3: 0.8–2 pinholes smaller than 0.5 mm in diameter
  1: more than 2 pinholes smaller than 0.5 mm in diameter or more than 1 pinhole larger than 0.5 mm in diameter Vent clogging (rated by the following criterion based on observation after consecutive four or eight shots)
  5: no clogging after eight shots
  4: slight clogging after eight shots, but no clogging after four shots
  3: slight clogging after four shots
  1: short-shot due to vent clogging at the fourth shot Stage shift (rated by the following criterion based on microscopic observation of the cross section (normal to the island surface) of a 160-pin QFP package (measuring 28×28×3.4 mm and containing a chip of 12×12 mm) which was postcured at 180° C. for 5 hours)
  5: dislocation less than 25 μm, with the stage remaining in the package
  4: dislocation of 25–50 μm, with the stage remaining in the package
  3: dislocation more than 50 μm, with the stage remaining in the package
  1: excessive dislocation, with the stage coming out of the package surface Reliability at high temperatures The epoxy resin compound was molded into a 16-pin DIP (dual inline package), which was subsequently postcured at 180° C. for 5 hours. The resulting semiconductor device was dipped in a soldering bath at 260° C. for 120 seconds and then allowed to stand in the air at 190° C. The wiring resistance was measured at intervals of 50 hours, and time for the resistance to reach ten times its initial value was regarded as reliability at high temperatures. The longer the time, the better the reliability. Incidentally, the semiconductor element for the package was formed by aluminum deposition (for wiring), nitride passivation (excluding aluminum pad), and interconnection with gold wire between the aluminum pad and the inner lead.

Reliability at high humidity

The epoxy resin compound was molded into the same package as mentioned above. After dipping in a soldering bath at 260° C. for 120 seconds, the package was tested in an atmosphere at 121° C. and 100% RH. Measurements were carried out at intervals of 50 hours, and time for the wire to break was regarded as reliability at high humidity. The longer the time, the better the reliability.

Resistance to soldering heat

The epoxy resin compound was molded into the packages of 100-pin QFP in which a polyimide-coated silicon chip is bonded to the die. After postcuring at 175° C. for 5 hours, the specimens were aged at 85° C. and 85% RH for different periods (at intervals of 12 hours). The specimens underwent IR reflow soldering, with the maximum temperature being 260° C. The soldered specimens were inspected for external cracking. The minimum aging period for the specimen to suffer cracking is regarded as resistance to soldering heat. The longer the aging period, the better the resistance to soldering heat.

TABLE 2

| | | Example No. | | | | | | | | | |
|---|---|---|---|---|---|---|---|---|---|---|---|
| | | 1 | 2 | 3 | 4 | 5 | 6 | 7 | 8 | 9 | 10 |
| Formulation of the compound (pbw) | Epoxy resin I | 13 | 13 | 8 | 8 | 8 | 8 | 8 | 8 | 8 | 8 |
| | Epoxy resin II | — | — | — | — | — | — | — | — | — | — |
| | Epoxy resin III | — | — | — | — | — | — | — | — | — | — |
| | Epoxy resin IV | — | — | — | — | — | — | — | — | — | — |
| | Hardener I | 7 | 7 | 6 | 6 | 6 | 6 | 6 | 6 | 6 | 6 |
| | Hardener II | — | — | — | — | — | — | — | — | — | — |
| | Hardener III | — | — | — | — | — | — | — | — | — | — |
| | Hardener IV | — | — | — | — | — | — | — | — | — | — |
| | Synthetic silica A-1 | 40 | — | — | — | — | — | — | — | — | — |
| | Synthetic silica A-2 | — | 40 | — | — | — | — | — | — | — | — |
| | Synthetic silica A-3 | — | — | 43 | — | — | — | — | — | — | — |
| | Synthetic silica A-4 | — | — | — | 43 | — | — | — | — | — | — |
| | Synthetic silica A-5 | — | — | — | — | 43 | — | 43 | 43 | 43 | 43 |
| | Synthetic silica A-6 | — | — | — | — | — | 43 | — | — | — | — |
| | Natural silica B-1 | 40 | 40 | 43 | 43 | 43 | 43 | — | — | — | — |
| | Natural silica B-2 | — | — | — | — | — | — | 43 | — | — | — |
| | Natural silica B-3 | — | — | — | — | — | — | — | 43 | — | — |
| | Natural silica B-4 | — | — | — | — | — | — | — | — | 43 | — |
| | Natural silica B-5 | — | — | — | — | — | — | — | — | — | 43 |
| Amount of silica[1] | | 79.3 | 79.3 | 85.2 | 85.2 | 85.2 | 85.2 | 85.2 | 85.2 | 85.2 | 85.2 |
| Amount of synthetic silica[2] | | 50.0 | 50.0 | 50.0 | 50.0 | 50.0 | 50.0 | 50.0 | 50.0 | 50.0 | 50.0 |
| Characteristic properties and results of rating | Melt viscosity (P) | 350 | 350 | 300 | 250 | 450 | 400 | 400 | 60 | 100 | 100 |
| | Hot hardness (BC) | 65 | 70 | 70 | 65 | 75 | 70 | 75 | 75 | 70 | 65 |
| | Resin peeling | 3 | 4 | 4 | 3 | 4 | 4 | 4 | 4 | 5 | 4 |
| | Pinholes | 5 | 5 | 5 | 5 | 5 | 5 | 5 | 5 | 4 | 5 |
| | Vent clogging | 5 | 5 | 5 | 5 | 5 | 5 | 5 | 5 | 5 | 5 |
| | Stage shift | 5 | 5 | 5 | 5 | 5 | 5 | 4 | 5 | 5 | 5 |
| | Reliability at high temperatute (h) | 650 | 700 | 700 | 700 | 750 | 700 | 750 | 800 | 700 | 650 |
| | Reliability at high humidity (h) | 400 | 550 | 650 | 600 | 700 | 700 | 700 | 700 | 700 | 700 |
| | Resistance to soldering heat (h) | 36 | 36 | 60 | 60 | 72 | 72 | 72 | 72 | 72 | 72 |

[1]Amount of silica: Content (wt %) of silica in the total amount of the compound.
[2]Amount of synthetic silica: Content (wt %) of synthetic silica in the total amount of silica.

TABLE 3

| | | Example No. | | | | | | | | | |
|---|---|---|---|---|---|---|---|---|---|---|---|
| | | 11 | 12 | 13 | 14 | 15 | 16 | 17 | 18 | 19 | 20 |
| Formulation of the compound (pbw) | Epoxy resin I | 8 | 8 | 6 | 6 | — | 6 | 6 | 6 | — | — |
| | Epoxy resin II | — | — | — | — | 6 | — | — | — | — | — |
| | Epoxy resin III | — | — | — | — | — | — | — | — | 6 | — |
| | Epoxy resin IV | — | — | — | — | — | — | — | — | — | 6 |
| | Hardener I | 6 | 6 | 4 | 4 | 4 | — | — | 3 | 4 | 4 |
| | Hardener II | — | — | — | — | — | 4 | — | — | — | — |
| | Hardener III | — | — | — | — | — | — | 4 | — | — | — |
| | Hardener IV | — | — | — | — | — | — | — | 1 | — | — |
| | Synthetic silica A-1 | — | — | — | — | — | — | — | — | — | — |
| | Synthetic silica A-2 | — | — | — | — | — | — | — | — | — | — |
| | Synthetic silica A-3 | — | — | — | — | — | — | — | — | — | — |

TABLE 3-continued

| | | Example No. | | | | | | | | | |
|---|---|---|---|---|---|---|---|---|---|---|---|
| | | 11 | 12 | 13 | 14 | 15 | 16 | 17 | 18 | 19 | 20 |
| | Synthetic silica A-4 | — | — | — | — | — | — | — | — | — | — |
| | Synthetic silica A-5 | 31 | 12 | 10 | 5 | 10 | 10 | 10 | 10 | 10 | 10 |
| | Synthetic Siliea A-6 | — | — | — | — | — | — | — | — | — | — |
| | Natutal silica B-1 | — | — | — | — | — | — | — | — | — | — |
| | Natural silica B-2 | — | — | — | — | — | — | — | — | — | — |
| | Natural silica B-3 | 55 | 74 | 80 | 85 | 80 | 80 | 80 | 80 | 80 | 80 |
| | Natural silica B-4 | — | — | — | — | — | — | — | — | — | — |
| | Natutal silica B-5 | — | — | — | — | — | — | — | — | — | — |
| Amount of silica[1] | | 85.2 | 85.2 | 89.2 | 89.2 | 89.2 | 89.2 | 89.2 | 89.2 | 89.2 | 89.2 |
| Amount of synthetic silica[2] | | 36.0 | 14.0 | 11.1 | 5.6 | 11.1 | 11.1 | 11.1 | 11.1 | 11.1 | 11.1 |
| Characteristic properties and results of rating | Melt viscosity (P) | 80 | 80 | 250 | 240 | 210 | 250 | 200 | 300 | 450 | 200 |
| | Hot hardness (BC) | 65 | 70 | 85 | 85 | 85 | 85 | 85 | 85 | 65 | 65 |
| | Resin peeling | 4 | 5 | 5 | 5 | 5 | 5 | 5 | 5 | 5 | 5 |
| | Pin holes | 5 | 5 | 5 | 5 | 5 | 5 | 5 | 5 | 5 | 5 |
| | Vent clogging | 5 | 5 | 5 | 5 | 5 | 5 | 5 | 5 | 5 | 5 |
| | Stage shift | 5 | 5 | 5 | 5 | 5 | 5 | 5 | 5 | 4 | 5 |
| | Reliability at high temperature (h) | 650 | 650 | 1500 | 1300 | 1100 | 1000 | 1500 | 1500 | 900 | 950 |
| | Reliability at high humidity (h) | 700 | 750 | 900 | 850 | 850 | 800 | 1000 | 800 | 850 | 800 |
| | Resistance to soldering heat (h) | 72 | 72 | 192 | 168 | 168 | 168 | 240 | 144 | 108 | 108 |

[1]Amount of silica: Content (wt %) of silica in the total amount of the compound.
[2]Amount of synthetic silica: Content (wt %) of synthetic silica in the total amount of silica.

TABLE 4

| | | Comparative Example No. | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| Formulation of the compound (pbw) | Epoxy resin I | 13 | 13 | 8 | 8 | 8 | 8 | 8 | 8 | 8 | 8 | 8 | 8 | 6 |
| | Epoxy resin II | — | — | — | — | — | — | — | — | — | — | — | — | — |
| | Epoxy resin III | — | — | — | — | — | — | — | — | — | — | — | — | — |
| | Epoxy resin IV | | | | | | | | | | | | | |
| | Hardener I | 7 | 7 | 6 | 6 | 6 | 6 | 6 | 6 | 6 | 6 | 6 | 6 | 4 |
| | Hardener II | — | — | — | — | — | — | — | — | — | — | — | — | — |
| | Hardener III | — | — | — | — | — | — | — | — | — | — | — | — | — |
| | Hardener IV | | | | | | | | | | | | | |
| | Synthetic silica A-1 | 80 | — | — | — | — | — | — | — | — | — | — | — | — |
| | Synthetic silica A-2 | — | 80 | — | — | — | — | — | — | — | — | — | — | — |
| | Synthetic silica A-3 | — | — | 86 | — | — | — | — | — | — | — | — | — | — |
| | Synthetic silica A-4 | — | — | — | 86 | — | — | — | — | — | — | — | — | — |
| | Synthetic silica A-5 | — | — | — | — | 86 | — | — | — | — | — | — | — | — |
| | Synthetic silica A-6 | — | — | — | — | — | 86 | — | — | — | — | — | — | — |
| | Natural silica B-1 | — | — | — | — | — | — | 86 | — | — | — | — | — | — |
| | Natural silica B-2 | — | — | — | — | — | — | — | 86 | — | — | — | 43 | — |
| | Natural silica B-3 | — | — | — | — | — | — | — | — | 86 | — | — | 43 | 90 |
| | Natural silica B-4 | — | — | — | — | — | — | — | — | — | 86 | — | — | — |
| | Natural silica B-5 | — | — | — | — | — | — | — | — | — | — | 86 | — | — |
| Amount of silica[1] | | 79.3 | 79.3 | 85.2 | 85.2 | 85.2 | 85.2 | 85.2 | 85.2 | 85.2 | 85.2 | 85.2 | 85.2 | 89.2 |
| Amount of synthetic silica[2] | | 100 | 100 | 100 | 100 | 100 | 100 | 0 | 0 | 0 | 0 | 0 | 0 | 0 |
| Characteristic properties and results of rating | Melt viscosity (P) | 900 | 1000 | 500 | 200 | 950 | 900 | 300 | 550 | 60 | 100 | 100 | 100 | 350 |
| | Hot hardness (BC) | 75 | 80 | 75 | 60 | 70 | 70 | 60 | 70 | 70 | 60 | 50 | 50 | 70 |
| | Resin peeling | 3 | 3 | 5 | 3 | 3 | 3 | 1 | 1 | 1 | 1 | 1 | 1 | 1 |
| | Pinholes | 5 | 1 | 5 | 1 | 1 | 1 | 1 | 1 | 3 | 1 | 5 | 5 | |
| | Vent clogging | 5 | 1 | 1 | 1 | 3 | 3 | 1 | 5 | 5 | 3 | 1 | 5 | 5 |
| | Stage shift | 1 | 1 | 4 | 5 | 1 | 1 | 5 | 5 | 5 | 5 | 5 | 5 | 5 |
| | Reliability at high tempertuere (h) | * | * | 450 | 450 | * | * | 400 | 200 | 300 | 350 | 300 | 400 | 300 |
| | Reliability at high humidity (h) | * | * | 300 | 250 | * | * | 250 | 200 | 200 | 200 | 200 | 300 | 300 |
| | Resistance to soldering heat (h) | * | * | 72 | 24 | * | * | 24 | 24 | 24 | 24 | 24 | 60 | 24 |

[1]Amount of silica: Content (wt %) of silica in the total amount of the compound.
[2]Amount of synthetic silica: Content (wt %) of synthetic silica in the total amount of silica.
*Specimens for rating were not obtained.

Examples 21 to 24

The same procedure as in Examples 1 to 20 was repeated except that the γ-glycidoxypropytriethoxysilane was replaced by N-(N-phenylaminoethyl)-γ-aminopropyltrimethoxysilane, which is a coupling agent having a secondary amino group. The results are shown in Table 5.

TABLE 5

| | | Example No. | | | |
|---|---|---|---|---|---|
| | | 21 | 22 | 23 | 24 |
| Formulation of the compound (pbw) | Epoxy resin I | 8 | 8 | 6 | 6 |
| | Epoxy resin II | — | — | — | — |
| | Epoxy resin III | — | — | — | — |
| | Epoxy resin IV | — | — | — | — |
| | Hardener I | 6 | 6 | 4 | 4 |
| | Hardener II | — | — | — | — |
| | Hardener III | — | — | — | — |
| | Hardener IV | — | — | — | — |
| | Synthetic silica A-1 | — | — | — | — |
| | Synthetic silica A-2 | — | — | — | — |
| | Synthetic silica A-3 | — | — | — | — |
| | Synthetic silica A-4 | — | — | — | — |
| | Synthetic silica A-5 | 43 | 31 | 10 | 5 |
| | Synthetic silica A-6 | — | — | — | — |
| | Natural silica B-1 | — | — | — | — |
| | Natural silica B-2 | — | — | — | — |
| | Natural silica B-3 | 43 | 55 | 80 | 85 |
| | Natural silica B-4 | — | — | — | — |
| | Natural silica B-5 | — | — | — | — |
| Amount of silica[1] | | 85.2 | 85.2 | 89.2 | 89.2 |
| Amount of synthetic silica[2] | | 50.0 | 36.0 | 11.1 | 5.6 |
| Characteristic properties and results of rating | Melt viscosity (P) | 50 | 70 | 200 | 190 |
| | Hot hardness (BC) | 75 | 65 | 85 | 85 |
| | Resin peeling | 5 | 5 | 5 | 5 |
| | Pinholes | 5 | 5 | 5 | 5 |
| | Vent clogging | 5 | 5 | 5 | 5 |
| | Stage shift | 5 | 5 | 5 | 5 |
| | Reliability at high temperature (h) | 900 | 750 | 1600 | 1400 |
| | Reliability at high humidity (h) | 800 | 750 | 1100 | 900 |
| | Resistance to soldering heat (h) | 96 | 96 | 216 | 192 |

[1] Amount of silica: Content (wt %) of silica in the total amount of the compound.
[2] Amount of synthetic silica: Content (wt %) of synthetic silica in the total amount of silica.

It is apparent from Tables 2, 3, and 5 that the epoxy resin compounds (in Examples 1 to 20) of the present invention exhibit good moldability without such troubles as short shot, resin peeling, stage shift, and vent clogging. In addition, they yield semiconductor packages superior in reliability at high temperatures and humidity and also in resistance to soldering heat and stage shift. This effect is remarkable particularly in the case where the compound is based on epoxy resin I (or biphenyl-type epoxy) or the compound contains more than 85 wt %, particularly more than 89 wt %, of silica. The effect is enhanced when the compound is incorporated with a silane coupling agent having secondary amino groups.

It is also noted that the epoxy resin compound is poor in moldability and is unable to yield reliable semiconductor packages if it is incorporated with synthetic silica alone or natural fused silica alone.

Because of the above-mentioned characteristic properties, the epoxy resin compound is suitable for use as a molding material of precision parts. In addition, the epoxy resin compound yields semiconductor packages having improved reliability at high temperatures and humidity and good resistance to soldering heat.

Exploitation in Industry

The epoxy resin compound of the present invention will find use as a molding material for precision parts because of its good moldability. It will also find use as a sealing material for reliable semiconductor packages.

We claim:

1. A semiconductor device comprising a semiconductor element sealed with an epoxy resin compound, said compound comprising:

(A) an epoxy resin containing a biphenl-type epoxy resin represented by formulae (I) or (II):

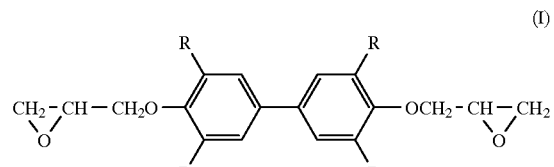

(I)

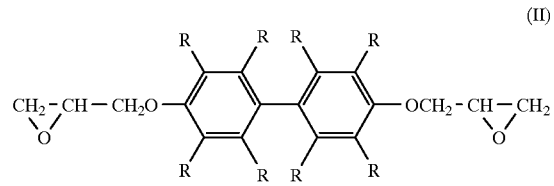

(II)

wherein the R's identically or differently denote hydrogen atoms or monovalent organic groups with 1 to 4 carbons, (B) a hardener containing at least two phenolic groups and/or naphtholic hydroxyl groups in the molecule, and (C) an inorganic filler comprising silica in an amount of more than 85 wt % of the total amount of the epoxy resin composition and wherein said silica is composed of 5–50 wt % of synthetic silica and 95–50 wt % of natural fused silica.

2. The semiconductor device defined in claim 1, wherein said inorganic filler comprises more than 85 wt % of the total amount of said epoxy resin compound.

3. The semiconductor device defined in claim 1, wherein said silica comprises more than 85 wt % of the total amount of said epoxy resin compound.

4. The semiconductor device defined in claim 1, wherein said silica (C) is composed of about 10–50 wt % of spherical synthetic silica and about 95–50 wt % of natural fused silica.

5. The semiconductor device defined in claim 1, wherein said natural fused silica comprises crushed silica in an amount less than 30 wt %.

6. The semiconductor device defined in claim 1, wherein said synthetic silica has an average particle diameter of about 0.1–30 μm and said natural fused silica has an average particle diameter of about 1–50μm.

7. The semiconductor device defined in claim 1, wherein said synthetic silica has an average particle diameter of about 0.1–3 μm and said natural fused silica has an average particle diameter of about 3–50μm.

8. An epoxy resin compound as defined in claim 1 which further comprises a silane coupling agent which has an epoxy group-containing organic group directly attached to the silicon atom.

9. An epoxy resin compound as defined in claim 1, which further comprises a silane coupling agent which has an amino group-containing organic group directly attached to the silicon atom.

10. An epoxy resin compound as defined in claim 9, wherein the silane coupling agent is one in which said amino group is a secondary amino group.

11. The semiconductor device defined in claim 1, said epoxy resin further comprising halogen and antimony in an amount less than 0.2 wt % each.

12. The semiconductor device defined in claim 1, wherein said semiconductor device is shaped into a precision part.

13. The semiconductor device defined in claim 1, wherein said epoxy resin compound is applied for semiconductor sealing.

14. In a process for producing a semiconductor device, the steps which comprise:

preparing an epoxy resin compound for semiconductor sealing, said process comprising fusing a substance composed mainly of naturally-occurring $SiO_2$, thereby making a natural fused silica, performing a chemical reaction on a silicon-containing substance which is not composed mainly of $SiO_2$, thereby making synthetic silica composed mainly of $SiO_2$, and mixing together an epoxy resin (A), a hardener (B) comprising at least two phenolic hydroxyl groups and/or naphtholic hydroxyl groups in the molecule, said synthetic silica and said natural fused silica obtained in said first step, wherein the total content of said natural silica and said synthetic silica is more than 85 wt % of the total amount of the resin compound, the content of synthetic silica and natural fused silica is 5–50 wt % and 95–50 wt %, respectively, of the total amount of silica and said epoxy resin (A) contains a biphenyl epoxy resin represented by formulae (I) or (II):

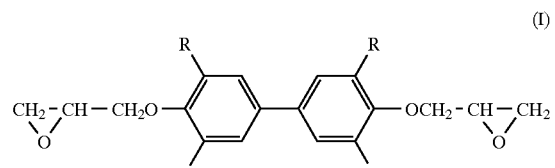

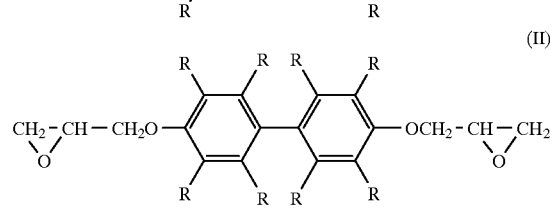

wherein the R's identically or differently denote hydrogen atoms or monovalent organic groups with 1 to 4 carbons.

* * * * *